(12) United States Patent
Ogata et al.

(10) Patent No.: US 10,256,388 B2
(45) Date of Patent: Apr. 9, 2019

(54) LIGHT-EMITTING DEVICE AND ILLUMINATION APPARATUS

(71) Applicant: PANASONIC INTELLECTUAL PROPERTY MANAGEMENT CO., LTD., Osaka (JP)

(72) Inventors: Toshifumi Ogata, Osaka (JP); Keiji Kiba, Osaka (JP); Shogo Yano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/873,538

(22) Filed: Jan. 17, 2018

(65) Prior Publication Data

US 2018/0219147 A1    Aug. 2, 2018

(30) Foreign Application Priority Data

Jan. 27, 2017  (JP) .................. 2017-013509

(51) Int. Cl.

| F21S 4/00 | (2016.01) |
| F21V 21/00 | (2006.01) |
| H01L 33/62 | (2010.01) |
| F21V 29/502 | (2015.01) |
| F21K 9/20 | (2016.01) |
| F21V 19/00 | (2006.01) |

(Continued)

(52) U.S. Cl.
CPC ............... *H01L 33/62* (2013.01); *F21K 9/20* (2016.08); *F21S 8/026* (2013.01); *F21V 19/005* (2013.01); *F21V 29/502* (2015.01); *H01L 25/0753* (2013.01); *H01L 33/08* (2013.01); *H01L 33/24* (2013.01); *H01L 33/50* (2013.01); *F21V 7/0083* (2013.01); *F21Y 2105/16* (2016.08); *F21Y 2105/18* (2016.08); *F21Y 2113/13* (2016.08); *F21Y 2115/10* (2016.08); *H01L 33/54* (2013.01); *H01L 33/60* (2013.01)

(58) Field of Classification Search
CPC .... F21K 9/20; F21K 9/238; F21S 8/00; F21S 8/02; F21S 8/026; F21V 7/00; F21V 7/0083; F21V 19/003; F21V 19/005; F21V 29/50; F21V 29/502; F21Y 2113/13; H01L 25/0753; H01L 33/08; H01L 33/24; H01L 33/50; H01L 33/54; H01L 33/60; H01L 33/62
USPC ....................... 362/249.02, 311.02
See application file for complete search history.

(56) References Cited

U.S. PATENT DOCUMENTS

| 2011/0278605 A1 | 11/2011 | Agatani et al. |
| 2012/0044669 A1 | 2/2012 | Ogata et al. |

FOREIGN PATENT DOCUMENTS

| JP | 2005-158958 | 6/2005 |
| JP | 2012-004519 | 1/2012 |

(Continued)

*Primary Examiner* — Jason M Han
(74) *Attorney, Agent, or Firm* — Greenblum & Bernstein P.L.C.

(57) ABSTRACT

A light-emitting device includes: a substrate; a first light emitter and a second light emitter which are disposed on the substrate; and a reflector which is disposed on the substrate and reflects light emitted by the first light emitter. The first light emitter, the reflector, and the second light emitter are aligned in stated order in a direction from a center toward a periphery of the substrate in a plan view. The first light emitter, the reflector, and the second light emitter decrease in height in stated order, the height being measured from the substrate.

20 Claims, 8 Drawing Sheets

(51) Int. Cl.
*H01L 33/08* (2010.01)
*H01L 33/24* (2010.01)
*H01L 33/50* (2010.01)
*F21S 8/02* (2006.01)
*H01L 25/075* (2006.01)
*H01L 33/60* (2010.01)
*F21V 7/00* (2006.01)
*F21Y 105/16* (2016.01)
*F21Y 115/10* (2016.01)
*F21Y 113/13* (2016.01)
*F21Y 105/18* (2016.01)
*H01L 33/54* (2010.01)

(56) References Cited

FOREIGN PATENT DOCUMENTS

| | | |
|---|---|---|
| JP | 2012-256908 | 12/2012 |
| JP | 2013-229492 | 11/2013 |

LIGHT-EMITTING DEVICE AND ILLUMINATION APPARATUS

CROSS REFERENCE TO RELATED APPLICATION

This application claims the benefit of priority of Japanese Patent Application Number 2017-013509 filed on Jan. 27, 2017, the entire content of which is hereby incorporated by reference.

BACKGROUND

1. Technical Field

The present disclosure relates to a light-emitting device and an illumination apparatus including the light-emitting device.

2. Description of the Related Art

Semiconductor light-emitting elements, such as light-emitting diodes (LEDs), are widely utilized as highly efficient and space-saving light sources in various light-emitting devices for lighting applications or display applications, for example.

For example, Japanese Unexamined Patent Application Publication No. 2012-256908 discloses a light source device which includes an LED module in which each element column of a plurality of LEDs is sealed by a light-transmissive resin material. Different colors of light can be emitted by the LED module described in Japanese Unexamined Patent Application Publication No. 2012-256908 by containing a different phosphor in the resin material in each element column of the LEDs.

SUMMARY

However, in the above-mentioned conventional LED module, when the light emitted from a certain element column enters the resin material of an adjacent element column, the phosphor contained in the resin material of the adjacent element column may be excited. In this case, the energy of light is lost by the phosphor, and thus light emission efficiency declines.

In view of above, an object of the present disclosure is to provide a light-emitting device which can reduce a decline in the light emission efficiency, and an illumination apparatus including the light-emitting device.

In order to achieve the above-mentioned object, a light-emitting device according to an aspect of the present disclosure includes: a substrate; a first light emitter and a second light emitter which are disposed on the substrate; and a reflector which is disposed on the substrate and reflects light emitted by the first light emitter. The first light emitter, the reflector, and the second light emitter are aligned in stated order in a direction from a center toward a periphery of the substrate in a plan view. The first light emitter, the reflector, and the second light emitter decrease in height in stated order, the height being measured from the substrate.

Furthermore, an illumination apparatus according to an aspect of the present disclosure includes: the light-emitting device; and a lighting apparatus which supplies the light-emitting device with electric power for causing the light-emitting device to emit light.

According to the present disclosure, a light-emitting device, etc. which can reduce the decline in the light emission efficiency can be provided.

BRIEF DESCRIPTION OF DRAWINGS

The figures depict one or more implementations in accordance with the present teaching, by way of examples only, not. by way of limitations. In the figures, like reference numerals refer to the same or similar elements.

DETAILED DESCRIPTION OF THE EMBODIMENTS

The following describes in detail a light-emitting device and an illumination apparatus according to embodiments of the disclosure with reference to the drawings. Note that each of the following embodiments shows merely a specific example of the present disclosure. Therefore, numerical values, shapes, materials, elements, arrangement and connection of the elements, steps, and an order of the steps etc., described in the following embodiments are given merely by way of examples, and are not intended to limit the present disclosure. Therefore, among the elements in the following embodiments, elements not recited in any one of independent claims defining the broadest concepts of the present disclosure are described as optional elements.

Moreover, each diagram is a schematic diagram and is not necessarily illustrated precisely. Accordingly, for example, each diagram is not necessarily to scale. Moreover, in each diagram, substantially the same configurations are assigned with the same reference signs, and duplicate description is omitted or simplified. Furthermore, expressions using "approximate", such as approximately parallel or approximate square, are used in the following embodiments. For example, approximately parallel does not only mean completely parallel, but also means substantially parallel. In other words, "approximate" allows for a margin of error of about a few percent, for example. The same applies to other expressions using "approximate."

Furthermore, the x axis, the y axis, and the z axis show three axes of a three-dimensional orthogonal coordinate system in the description and drawings of the present specification. In each embodiment, a z-axis direction is a vertical direction, and the direction perpendicular to the z axis (direction parallel to an x-y plane) is a horizontal direction. Note that the positive direction in the z axis is a vertically downward direction (light-emitting direction). Moreover, in the present specification, a "thickness direction" means the thickness direction of the light-emitting device, and is a direction perpendicular to a principal surface of a substrate, and a "plan view" is a view in the direction perpendicular to the principal surface of the substrate.

Embodiment 1

Overview

Figure 1:
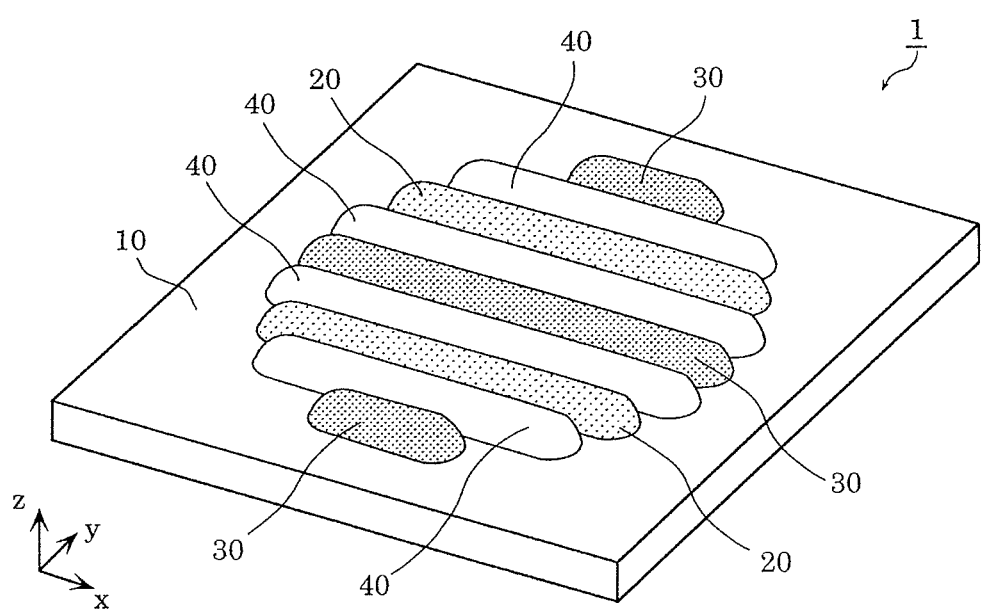
FIG. 1 is an external perspective view of a light-emitting device according to Embodiment 1.
Figure 2:
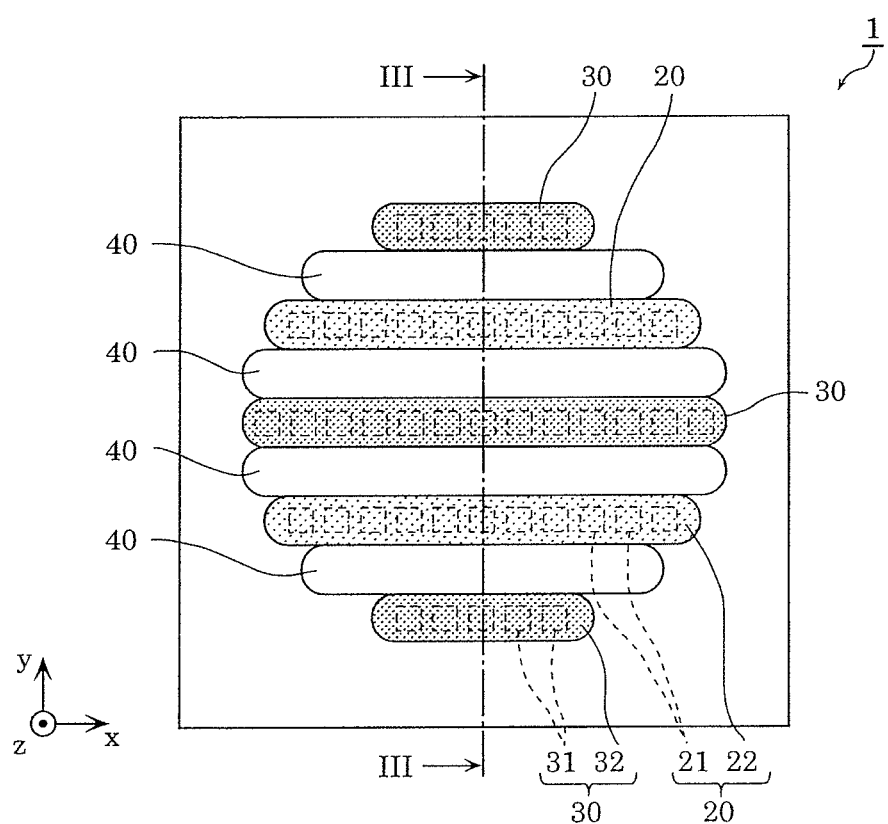
FIG. 2 is a plan view of the light-emitting device according to Embodiment 1.
Figure 3:
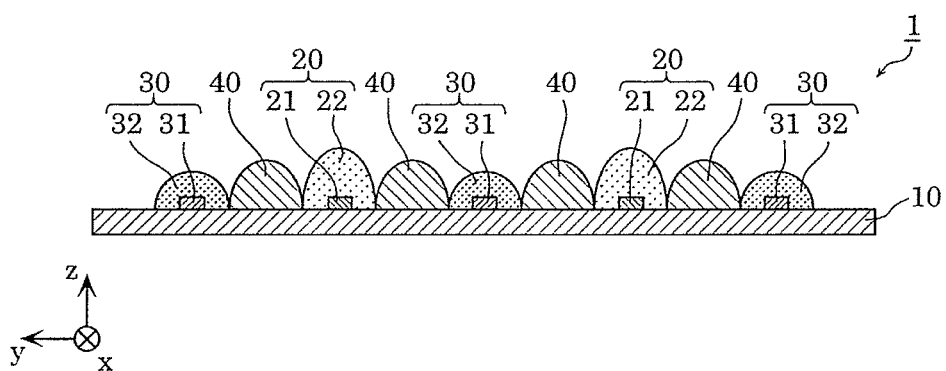
FIG. 3 is a cross-sectional view of the light-emitting device according to Embodiment 1, taken along line III-III in FIG. 2.

First, an overview of the light-emitting device according to Embodiment 1 is described with reference to FIGS. 1 to 3. FIG. 1 is an external perspective view of light-emitting device 1 according to the present embodiment. FIG. 2 is a plan view of light-emitting device 1 according to the present embodiment. FIG. 3 is a cross-sectional view of light-emitting device 1 according to the present embodiment, taken along line III-III of FIG. 2. Note that a wiring pattern on substrate 10, bonding wires, etc. which are used for electrical connection of LED chips are not illustrated in each diagram.

As illustrated in FIGS. 1 to 3, light-emitting device 1 according to the present embodiment includes substrate 10, first light emitters 20, second light emitters 30, and reflectors 40. As illustrated in FIGS. 2 and 3, each of first light emitters 20 includes a plurality of first LED chips 21 and first sealing member 22. Each of second light emitters 30 includes a plurality of second LED chips 31 and second sealing member 32. Light-emitting device 1 outwardly emits mixed light including light (first light) emitted by first light emitters 20 and light (second light) emitted by second light emitters 30.

Note that, in the following, first light emitters 20 and second light emitters 30 may be collectively called "light emitters." Similarly, first LED chips 21 and second LED chips 31 may be collectively called "LED chips." First sealing members 22 and second sealing members 32 may be collectively called "sealing members."

Light-emitting device 1 is an LED module having a so-called chip-on-board (COB) structure in which an LED chip is directly mounted on substrate 10. On substrate 10, a plurality of lines of light-emitting elements (light emitters) including a plurality of LED chips are provided. Reflectors 40 are provided between the lines of the light-emitting elements. Specifically, as illustrated in FIGS. 1 and 2, five lines of the light-emitting elements (two first light emitters 20 and three second light emitters 30) and four lines of reflectors 40 are disposed alternately. As illustrated in FIG. 3, the cross-sectional shapes of first light emitters 20 are the same. For example, first light emitters 20 are identical in height. Similarly, the cross-sectional shapes of second light emitters 30 are the same. For example, second light emitters 30 are identical in height. The cross-sectional shapes of reflectors 40 are the same. For example, reflectors 40 are identical in height.

In the present embodiment, as illustrated in FIGS. 1 and 2, first light emitters 20, reflectors 40, and second light emitters 30 are respectively disposed in approximately parallel lines (lines approximately parallel to the x axis).

Specifically, as illustrated in FIGS. 1 and 2, two first light emitters 20, three second light emitters 30, and four reflectors 40 are disposed on substrate 10. First light emitters 20 and second light emitters 30 are disposed alternately in an alignment direction (y-axis direction) in which first light emitters 20 and second light emitters 30 are aligned. Reflectors 40 are disposed between first light emitters 20 and second light emitters 30.

Note that in the present embodiment, although each reflector 40 is in contact with the adjacent first light emitter 20 and the adjacent second light emitter 30 as illustrated in FIG. 3, the configuration is not limited to this. A space may be provided at least one of between reflector 40 and first light emitter 20 and between reflector 40 and second light emitter 30.

As illustrated in FIG. 2, first light emitters 20, reflectors 40, and second light emitters 30 are provided symmetrically with respect to the center of substrate 10 in a plan view of substrate 10. Specifically, first light emitters 20, reflectors 40, and second light emitters 30 are provided point-symmetrically to the center of substrate 10 as the center of symmetry. Moreover, first light emitters 20, reflectors 40, and second light emitters 30 are provided line-symmetrically with respect to a line parallel to the x axis and passing through the center of substrate 10 or a line parallel to the y axis (corresponding to line III-III) as the axis of symmetry.

The following describes details of each of the component members of light-emitting device 1.

Substrate

Substrate 10 is a mounting board for mounting first LED chips 21 and second LED chips 31. Substrate 10 is provided with metallic wires (not illustrated) for supplying electric power to first LED chips 21 and second LED chips 31. Substrate 10 is a ceramic substrate which includes ceramics, for example. Note that substrate 10 may be a resin substrate having a base material of a resin, or may be a glass substrate. Alternatively, substrate 10 may be a metal base substrate which is a metal plate covered with an insulating film.

As the ceramic substrate, an alumina substrate which includes aluminum oxide (alumina), or an aluminum nitride substrate which includes aluminum nitride is used, for example. Moreover, as the metal base substrate, an aluminum alloy substrate, an iron alloy substrate, or a copper alloy substrate which has a surface on which an insulating film is formed is used, for example. As the resin substrate, a glass epoxy substrate which includes glass fiber and an epoxy resin is used, for example.

A white substrate having a high light reflectance (for example, a light reflectance of 90% or higher) may be used as substrate 10. By using a white substrate, the light emitted by first LED chip 21 and second LED chip 31 can be reflected off the surface of substrate 10, and thus the light extraction efficiency can be improved. For example, a white ceramic substrate which includes alumina (white alumina substrate) can be used as substrate 10.

Moreover, a light-transmissive substrate having a high light transmittance may also be used as substrate 10. As the light-transmissive substrate, a light-transmissive ceramic substrate which includes polycrystalline alumina or aluminum nitride, a transparent glass substrate, a sapphire substrate, or a transparent resin substrate can be used, for example.

Although the plan view shape of substrate 10 is a quadrilateral shape in the present embodiment, other shapes such as a circular or polygonal shape may be used.

Light Emitter

First light emitter 20 and second light emitter 30 are light emitters (light-emitting element lines) disposed on substrate 10. In the present embodiment, first light emitter 20 and second light emitter 30 emit light having colors different from each other. Specifically, the color temperature (first color temperature) of the light (first light) emitted by first light emitter 20, and the color temperature (second color temperature) of the light (second light) emitted by second light emitter 30 are different from each other. More specifically, the color temperature of the light emitted by first light emitter 20 is lower than the color temperature of the light emitted by second light emitter 30. The color temperature of the light emitted by first light emitter 20 is, for example, at most 3000 K, and in one example, is 2700 K. The color temperature of the light emitted by second light emitter 30 is, for example, at least 5000 K, and in one example, is 6200 K. In other words, first light emitter 20 emits white light having the color of an incandescent bulb, and second light emitter 30 emits white light of a daylight color.

In the present embodiment, first light emitters 20 and second light emitters 30 can be driven independently. Specifically, it is possible to cause only first light emitters 20 to emit light, cause only second light emitters 30 to emit light, or causing both first light emitters 20 and second light emitters 30 to emit light or stop emitting light. More specifically, the intensity of light of first light emitters 20 and the intensity of light of second light emitters 30 can be changed independently of each other, i.e., independent dimming is possible. By dimming first light emitters 20 and second light emitters 30, the intensity of light emitted by light-emitting device 1 can be changed.

First LED chips 21 included in first light emitter 20 are one example of the first light-emitting elements, and are directly mounted on substrate 10. Each of first LED chips 21 is, for example, a gallium-nitride-based blue LED chip which includes an InGaN-based material and has a center wavelength (a peak wavelength of emission spectrum) in a range of from 430 nm to 480 nm.

Second LED chips 31 included in second light emitter 30 are one example of the second light-emitting elements, and are directly mounted on substrate 10. In the present embodiment, second LED chips 31 are blue LED chips which have the same configuration as first LED chips 21. Note that second LED chips 31 may be different LED chips from first LED chips 21. For example, their emission wavelengths, etc. may be different.

According to the present embodiment, first LED chips 21 and second LED chips 31 are respectively disposed in lines approximately parallel to the x-axis direction. Although not illustrated in FIGS. 1 to 3, all first LED chips 21 are electrically connected such that first LED chips 21 can be caused to emit light and stop emitting light collectively. All second LED chips 31 are also electrically connected such that second LED chips 31 can be caused to emit light and stop emitting light collectively.

Here, first LED chips 21 in a line are connected to adjacent chips by chip to chip with bonding wires (not illustrated) for supplying power. Second LED chips 31 are also connected in the same manner. Bonding wires and wires include metallic materials, such as gold (Au), silver (Ag), or copper (Cu), for example.

Note that, although not illustrated in FIGS. 1 to 3, electrodes for supplying electric power to first LED chips 21 from an external device, and electrodes for supplying electric power to second LED chips 31 from the external device are disposed on substrate 10 electrically independently from each other. In other words, the light emission of first LED chips 21 and the light emission of second LED chips 31 can be controlled independently. With this configuration, first light emitters 20 and second light emitters 30 are driven independently.

First sealing member 22 is a sealing member which covers first LED chips 21. First sealing member 22 collectively covers one line of first LED chips 21 aligned along the x-axis direction. In other words, first sealing member 22 is formed into a line shape along the x-axis direction. The outline of first sealing member 22 corresponds to the outline of first light emitter 20. First sealing member 22 (first light emitter 20) is formed into a semicircular pillar shape which extends in the x-axis direction.

Second sealing member 32 is a sealing member which covers the plurality of second LED chips 31. Second sealing member 32 collectively covers one line of second LED chips 31 aligned along the x-axis direction. In other words, second sealing member 32 is formed into a line shape along the x-axis direction. The outline of second sealing member 32 corresponds to the outline of second light emitter 30. Second sealing member 32 (second light emitter 30) is formed into a semicircular pillar shape which extends in the x-axis direction.

First sealing member 22 and second sealing member 32 each include a light-transmissive resin material, for example. As a light-transmissive resin material, for example, a methyl-based silicone resin is used, and an epoxy resin or a urea resin may also be used.

First sealing member 22 contains a wavelength conversion material which converts the wavelengths of light emitted by first LED chips 21. Second sealing member 32 contains a wavelength conversion material which converts the wavelengths of light emitted by second LED chips 31.

Specifically, first sealing member 22 and second sealing member 32 each contain a yellow phosphor. In the present embodiment, first sealing member 22 and second sealing member 32 each further contain a red phosphor and a green phosphor.

The yellow phosphor is, for example, an yttrium aluminum garnet (YAG)-based phosphor having an emission peak wavelength of at least 550 nm and at most 570 nm. The green phosphor is, for example, $Y_3(Al, Ga)_5O_{12}:Ce^{3+}$ phosphor or $Lu_3Al_5O_{12}:Ce^{3+}$ phosphor having an emission peak wavelength of at least 515 nm and at most 550 nm. The red phosphor is, for example, $CaAlSiN_3:Eu^{2+}$ phosphor (CASN phosphor), or $(Sr, Ca)AlSiN_3:Eu^{2+}$ phosphor (SCASN phosphor) having an emission peak wavelength of at least 640 nm and at most 670 nm.

White light is emitted as combined light (mixed light) of the blue light emitted by first LED chips 21 or second LED chips 31, and the yellow light, the red light, and the green light emitted by respective types of the phosphors. The light color (color temperature) of the white light is adjusted according to the amounts of the phosphors contained in the sealing members.

Specifically, the amounts of the red phosphor and the green phosphor contained in first sealing member 22 are greater than the amounts of the red phosphor and green phosphor contained in second sealing member 32. This allows the light color (color temperature) of first light emitter 20 and second light emitter 30 to be different from each other. In other words, first light emitter 20 emits light having a low color temperature, and second light emitter 30 emits light having a high color temperature.

Note that in the present embodiment, although the same types of phosphors are contained in first sealing member 22 and second sealing member 32 and the colors of light emitted by first light emitter 20 and second light emitter 30 are different by containing different amounts of the phosphors in first sealing member 22 and second sealing member 32, the configuration is not limited to this. The types and the number of the wavelength conversion materials contained in first sealing member 22, and the types and the number of the wavelength conversion materials contained in second sealing member 32 may be different from each other. For example, second sealing member 32 may contain the yellow phosphor and the green phosphor, and does not need to contain the red phosphor.

In the present embodiment, first light emitter 20 and second light emitter 30 are approximately identical in length in the transverse direction (y-axis direction) (i.e., the widths of the light emitters). First light emitter 20 and second light emitter 30 are different in length in the longitudinal directions (x-axis direction). For example, as illustrated in FIG. 2, in the plan view, the lengths in the longitudinal directions of first light emitters 20 and second light emitters 30 are set such that the total area of first light emitters 20 and the total area of second light emitters 30 are approximately equal. This enables the amount of light emitted by first light emitters 20 and the amount of light of the light emitted by second light emitters 30 as the whole light-emitting device 1 to be approximately the same.

Reflector

Reflector 40 reflects light emitted by first light emitter 20. Specifically, reflector 40 reflects visible light. In other words, reflector 40 reflects not only light emitted by first light emitter 20, but also light emitted by second light emitter 30.

In the present embodiment, reflector 40 is formed using a thermosetting resin or a thermoplastic resin etc. having light reflective properties. Specifically, reflector 40 is formed using a white resin material (so-called a white resin). Reflector 40 is formed using a silicone resin, a phenol resin, an epoxy resin, etc., for example.

In reflector 40, particles (filler) such as silica ($SiO_2$), titanium oxide ($TiO_2$), aluminum oxide ($Al_2O_3$), (zirconium dioxide ($ZrO_2$), or magnesium oxide (MgO) may be distributed. This further improves the light reflective properties of reflector 40.

Reflector 40 is disposed on substrate 10. Specifically, reflector 40 is located between first light emitter 20 and second light emitter 30. In the present embodiment, the length in the transverse direction (y-axis direction) of reflector 40 (the width of reflector 40) is approximately the same as the widths in the transverse direction of first light emitter 20 and second light emitter. The length in the longitudinal direction (x-axis direction) of reflector 40 is longer than the length in the longitudinal direction (x-axis direction) of at least one of an adjacent first light emitter 20 and an adjacent second light emitter 30, for example.

Characteristic Configuration

Here, characteristic configurations of light-emitting device 1 according to the present embodiment will be described.

Figure 4:
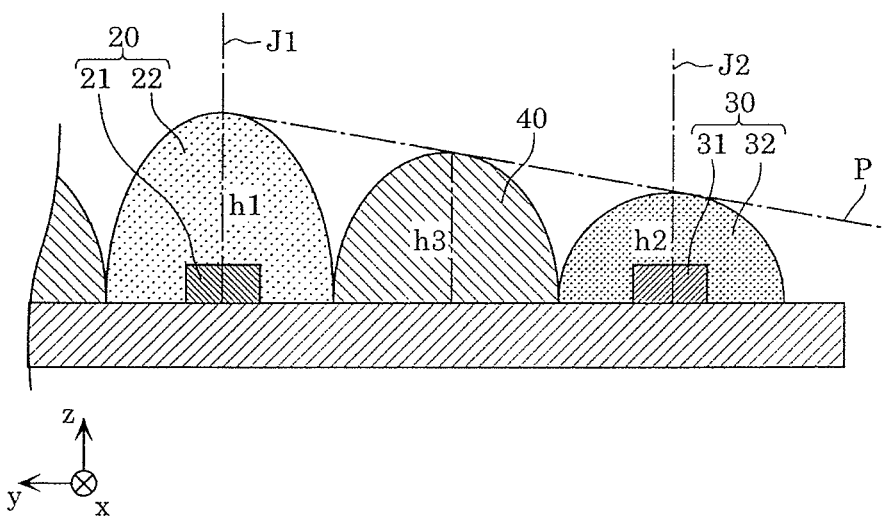
FIG. 4 is an enlarged cross-sectional view illustrating the vicinity of the periphery of the light-emitting device according to Embodiment 1.

The characteristic configurations of light-emitting device 1 in the present embodiment are provided in the vicinity of the periphery of substrate 10. Accordingly, in the following, the characteristic configurations are described by particularly focusing on the vicinity of the periphery of substrate 10 of light-emitting device 1. Specifically, second light emitter 30, reflector 40, and first light emitter 20 which are the nearest to the periphery of substrate 10 are described with reference to FIG. 4, by referring appropriately to FIGS. 1 to 3. FIG. 4 is an enlarged cross-sectional view illustrating the vicinity of the periphery of substrate 10 of light-emitting device 1 according to the present embodiment. In FIG. 4, second light emitter 30, reflector 40, and first light emitter 20 which are nearest to the periphery of substrate 10 are illustrated. In other words, second light emitter 30 illustrated in FIG. 4 is a second light emitter nearest to the periphery of substrate 10 among the plurality of second light emitters 30. Reflector 40 illustrated in FIG. 4 is a reflector nearest to the periphery of substrate 10 among the plurality of reflectors 40. First light emitter 20 illustrated in FIG. 4 is a first light emitter nearest to the periphery of substrate 10 among the plurality of first light emitters 20.

As illustrated in FIGS. 1 to 4, first light emitter 20, reflector 40, and second light emitter 30 are aligned in stated order in the direction from the center toward the periphery of substrate 10 in the plan view. In this case, as illustrated in FIG. 4, first light emitter 20, reflector 40, and second light emitter 30 decrease in height from substrate 10 in stated order. In other words, height h1 of first light emitter 20, height h2 of second light emitter 30, and height h3 of reflector 40 satisfy h1>h3>h2.

Height h1 of first light emitter 20 is specified as the height of the highest portion from substrate 10 on the external surface of first sealing member 22 in the present embodiment. Specifically, as illustrated in FIG. 4, height h1 is the height at the intersection of optical axis J1 of first LED chip 21 and the external surface of first sealing member 22. Similarly, height h2 of second light emitter 30 is the height at the intersection of optical axis J2 of second LED chip 31 and the external surface of second sealing member 32. In the present embodiment, optical axis J1 and optical axis J2 are located at the center of the width of first sealing member 22 and the center of the width of second sealing member 32, respectively. Height h3 of reflector 40 is the height at the center portion of the width of reflector 40.

Figure 5:
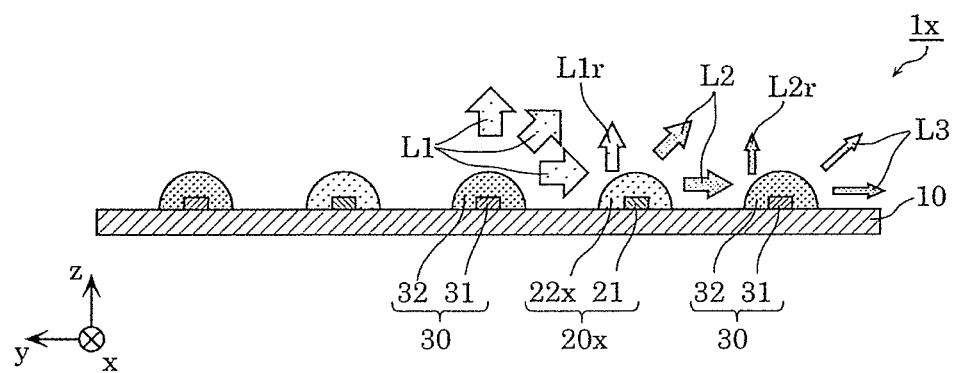
FIG. 5 is a cross-sectional view for illustrating factors for causing color unevenness in a light-emitting device according to a comparative example.
Figure 6:
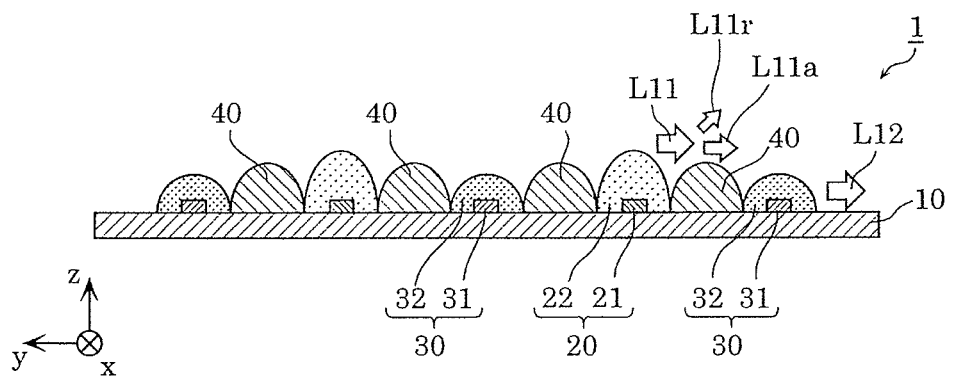
FIG. 6 is a cross-sectional view for illustrating effects of the light-emitting device according to Embodiment 1.

Here, effects of light-emitting device 1 according to the present embodiment are described with reference to FIGS. 5 and 6. FIG. 5 is a cross-sectional view for illustrating factors for causing color unevenness in light-emitting device 1x according to a comparative example. FIG. 6 is a cross-sectional view for illustrating effects of light-emitting device 1 according to the present embodiment.

As illustrated in FIG. 5, reflector 40 is not provided in light-emitting device 1x according to the comparative example. Moreover, in light-emitting device 1x, first light emitter 20x (first sealing member 22x) has approximately the same height as second light emitter 30 (second sealing member 32).

Light L1 emitted from second light emitter 30 is emitted not only to a direction perpendicular to substrate 10 (upward to the plane in FIG. 5) but laterally along substrate 10, as illustrated in FIG. 5. Although L1r which is part of light L1 emitted laterally is reflected off the boundary surface of the adjacent first light emitter 20x, the remaining light enters first sealing member 22x of first light emitter 20x.

The light which has entered first sealing member 22x is wavelength-converted by the phosphor material contained in first sealing member 22x and emitted as light L2. Light L2 is light which contains more long wavelength components than light L1, for example.

Similarly, although light L2r which is part of light L2 is reflected off the boundary surface of second light emitter 30, the remaining light enters second sealing member 32 of second light emitter 30. The light which has entered second sealing member 32 is wavelength-converted by the phosphor material contained in second sealing member 32 as light L3. Light L3 is light which contains more long wavelength components than light L2, for example.

As described above, in light-emitting device 1x according to the comparative example, long wavelength components are contained more in the light emitted from each of the light emitters, as the position of a light emitter becomes farther from the center toward the periphery of substrate 10. Accordingly, in the plan view of substrate 10, slightly reddish light is emitted in the vicinity of the periphery compared to the vicinity of the center of substrate 10. Thus, a problem with light-emitting device 1x according to the comparative example is color unevenness of light to be emitted.

Moreover, energy is lost by the wavelength conversion by the phosphor whenever light enters the sealing member of other light emitters. Accordingly, the intensity of the light which has passed more light emitters becomes small. Thus, light-emitting device 1x according to the comparative example has a problem that the light emission efficiency declines.

On the other hand, in light-emitting device 1 according to the present embodiment, as illustrated in FIG. 6, part of light L11 (light L11r) emitted laterally is reflected by reflector 40 and hardly enters the adjacent light emitter (second light emitter 30). Accordingly, the wavelength conversion by the adjacent light emitter is reduced, and generation of color unevenness can be reduced.

Moreover, since the height of first light emitter 20 is higher than the height of reflector 40, part of light L11 (light L11a) emitted laterally from first light emitter 20 is emitted laterally as it is, without being reflected by reflector 40 and without entering second light emitter 30. Accordingly, the difference of the light irradiation area can be reduced between the cases where only first light emitters 20 are caused to emit light (light L11) and where only second light emitters 30 are caused to emit light (light L12). In other words, generation of luminance unevenness can be reduced in light-emitting device 1 according to the present embodiment.

Note that tangent P which is in contact with the external surface of first sealing member 22 (first light emitter 20) and the external surface of second sealing member 32 (second light emitter 30) is illustrated in FIG. 4. In the present embodiment, reflector 40 is formed such that reflector 40 is in contact with tangent P.

With this configuration, light to be reflected by reflector 40 among the light emitted laterally from first light emitter 20 can be reduced as much as possible. Accordingly, the light emission efficiency of lateral light can be improved. Since most light which has not been reflected by reflector 40 does not enter second light emitter 30 at this time, generation of color unevenness can also be reduced.

Note that reflector 40 may be projected from tangent P. Although lateral light of first light emitter 20 is reduced in this case, generation of color unevenness can be further reduced. Reflector 40 may be lower than tangent P. Although part of light emitted by first light emitter 20 enters second light emitter 30 and the effect of reducing color unevenness is smaller in this case, the extraction efficiency of the lateral light can be improved.

Moreover, in the present embodiment, although an example is shown in which, in the vicinity of the periphery of substrate 10, first light emitter 20, reflector 40, and second light emitter 30 decrease in height from substrate 10 in stated order from the center toward the periphery, the configuration is not limited to this.

For example, first light emitters 20, reflectors 40, and second light emitters 30 may decrease in height in stated order from the center toward the periphery on the whole surface of substrate 10. In other words, a light emitter or reflector nearer to the center of substrate 10 may have a higher height from substrate 10, and a light emitter nearer to the periphery of substrate 10 may have a lower height from substrate 10.

For example, in the example illustrated in FIG. 3, the height of second light emitter 30 positioned at the center may be the highest, and the height of two second light emitters 30 positioned in the periphery may be the lowest. Among the four reflectors 40, the heights of two reflectors 40 which are closer to the center may be higher than the heights of two reflectors 40 which are closer to the periphery.

Alternatively, first light emitter 20, reflector 40, and second light emitter 30 may decrease in height from substrate 10 from the center toward the periphery, only in the vicinity of the center of substrate 10. Accordingly, first light emitter 20, reflector 40, and second light emitter 30 may decrease in height from substrate 10 in stated order, in an arbitrary portion of substrate 10.

CONCLUSION

As described above, light-emitting device 1 according to the present embodiment includes: substrate 10; first light emitter 20 and second light emitter 30 which are disposed on substrate 10; and reflector 40 which is disposed on substrate 10 and reflects light emitted by first light emitter 20. First light emitter 20, reflector 40, and second light emitter 30 are aligned in stated order in a direction from a center toward a periphery of substrate 10 in a plan view. First light emitter 20, reflector 40, and second light emitter 30 decrease in height in stated order, the height being measured from substrate 10.

With this configuration, since reflector 40 is provided between first light emitter 20 and second light emitter 30, light emitted by first light emitter 20 is reflected by reflector 40 and hardly enters second light emitter 30. Since this reduces attenuation (reduction in energy) of light due to light entering second light emitter 30, decline in the light emission efficiency can be reduced.

Moreover, since the heights decrease in order of first light emitter 20, reflector 40, and second light emitter 30, part of the light emitted laterally from first light emitter 20 is emitted laterally as it is, without being reflected by reflector 40 or entering second light emitter 30. Accordingly, the difference of the light irradiation area can be reduced between the cases where only first light emitters 20 are caused to emit light and where only second light emitters 30 are caused to emit light. In other words, generation of luminance unevenness can be reduced in light-emitting device 1 according to the present embodiment.

Moreover, for example, first light emitter 20, reflector 40, and second light emitter 30 are respectively disposed in approximately parallel lines.

With this configuration, LED chips can be mounted along one direction (x-axis direction), and thus LED chips can be mounted easily. Specifically, since all the LED chips can be mounted with the same orientation, generation of an error of the orientation of the mounted LED chips can be reduced. Moreover, when the sealing member is formed by applying a resin material in a line shape with a dispenser etc., the resin material can be applied easily. Accordingly, a uniform-shaped sealing member can be formed more easily. As a result, yield can be improved and a reliable light-emitting device 1 can be realized.

Furthermore, for example, a first color temperature of first light emitted by first light emitter 20, and a second color temperature of second light emitted by second light emitter 30 are different from each other.

With this configuration, as described with reference to FIG. 5 and FIG. 6, generation of color unevenness can be reduced.

Furthermore, for example, first light emitter 20, reflector 40, and second light emitter 30 are provided symmetrically with respect to the center of substrate 10 in the plan view of substrate 10.

With this configuration, since first light emitter 20, reflector 40, and second light emitter 30 are provided symmetrically in the plan view, approximately uniform light is likely to be emitted to all directions. Therefore, generation of luminance unevenness and color unevenness can be reduced in light-emitting device 1 according to the present embodiment.

Variations of Embodiment 1

The following describes Variations 1 to 3 of Embodiment 1. In each of the following variations, description focusing on differences from Embodiment 1 will be given, and description of common features are omitted or simplified.

Variation 1

Figure 7:
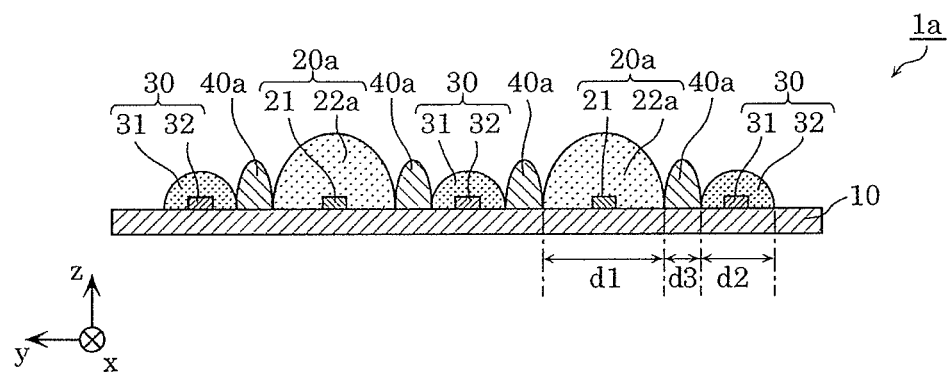
FIG. 7 is a cross-sectional view of a light-emitting device according to Variation 1 of Embodiment 1.

First, a light-emitting device according to Variation 1 is described with reference to FIG. 7. FIG. 7 is a cross-sectional view of light-emitting device 1a according to the present variation.

As compared with light-emitting device 1 according to Embodiment 1, light-emitting device 1a according to the present variation differs in that first light emitters 20a and reflectors 40a are provided instead of first light emitters 20 and reflectors 40. In the present variation, width d1 of first light emitter 20a and width d3 of reflector 40a differ from width d2 of second light emitter 30 in the alignment direction (y-axis direction) in which the light emitters and the reflectors are aligned.

Specifically, as illustrated in FIG. 7, in the alignment direction, the length (i.e., width d1) of first light emitter 20a is longer than the length (i.e., width d2) of second light emitter 30. Width d1 is the breadth (the length in the transverse direction) of first sealing member 22a. Width d2 is the breadth (the length in the transverse direction) of second sealing member 32. In the present variation, first sealing member 22a is formed thickly, and second sealing member 32 is formed thinly.

Since width d1 is longer, the height of first sealing member 22a from substrate 10 can be easily made high. For example, in the y-z cross section illustrated in FIG. 7, the aspect ratio (width d1: height h1) of first sealing member 22a and the aspect ratio (width d2: height h2) of second sealing member 32 may be the same.

Moreover, in the present variation, as illustrated in FIG. 7, in the alignment direction, the length (i.e., width d3) of reflector 40a is shorter than the length (width d1) of first light emitter 20a and the length (width d2) of second light emitter 30. Note that height h3 of reflector 40a is lower than height h1 of first light emitter 20a, and higher than height h2 of second light emitter 30 as in Embodiment 1. Therefore, the aspect ratio (width d3: height h3) of reflector 40a is greater than the aspect ratio of second light emitter 30, and reflector 40a is formed to be elongated in the height direction in the cross sectional view.

As described above, in light-emitting device 1a according to the present variation, for example, the color temperature of the light emitted by first light emitter 20a is lower than the color temperature of the light emitted by second light emitter 30, and the length (width d1) of first light emitter 20a is longer than the length (width d2) of second light emitter 30 in the alignment direction in which first light emitter 20a, reflector 40a, and second light emitter 30 are aligned.

With this configuration, the adherence area between first light emitter 20a and substrate 10 and the contact area in which first light emitter 20a is in contact with the surrounding air become larger by making width d1 of first light emitter 20a longer than width d2 of second light emitter 30. Therefore, the heat dissipation effect of first light emitter 20a can be improved. Since the amount of heat generated by first light emitter 20a which emits light having a low color temperature is larger than the amount of heat generated by of second light emitter 30 which emits light having a high color temperature, the heat generated by first light emitter 20a, which generates a larger amount of heat, can be dissipated effectively.

Moreover, in light-emitting device 1a according to the present variation, the number of first light emitters 20a differs from the number of second light emitters 30. Specifically, the number (two) of first light emitters 20a is less than the number (three) of second light emitters 30. Therefore, for example, in the case where first light emitter 20a and second light emitter 30 are identical in length in the longitudinal direction (x-axis direction) such that an approximate square light emission region is formed, and when width d1 and width d2 are equal, the area occupied by first light emitters 20a in the light emission region differs from the area occupied by second light emitters 30 in the light emission region.

Regarding this matter, in light-emitting device 1a according to the present variation, since width d1 of each of first light emitters 20a which are fewer in number is larger than width d2 of each of second light emitters 30 which are greater in number, area difference between the area of first light emitters 20a in the light emission region and the area of second light emitters 30 in the light emission region can be reduced. For example, when the lengths of first light emitter 20a and second light emitter 30 are the same, the ratio of the areas can be made the same by setting the ratio of width d1 to width d2 as a reciprocal ratio of the number of first light emitters 20a to the number of second light emitters 30.

Moreover, in the present variation, reflector 40a itself does not emit light. Therefore, when the area occupied by reflectors 40a in the light emission region (specifically, mounting region of LED chips) of substrate 10 is large, the light emission efficiency declines.

Regarding this matter, for example, in light-emitting device 1a according to the present variation, the length (width d3) of reflector 40a is shorter than the length (width d1) of first light emitter 20a and the length (width d2) of second light emitter 30, in the alignment direction in which first light emitter 20a, reflector 40a, and second light emitter 30 are aligned.

With this configuration, since the area occupied by reflectors 40a in the light emission region can be reduced, decline in the light emission efficiency can be reduced. In other words, a larger light emitter can be formed by reducing the area of reflector 40a. For example, since the number of the LED chips to be mounted can be increased, the light emission efficiency of light-emitting device 1a can be improved.

Note that in the present variation, although width d1 of first light emitter 20a which emits light having a low color temperature is larger than width d2 of second light emitter 30 which emits light having a high color temperature, it may be vice versa. In other words, width d2 of second light emitter 30 which emits light having a high color temperature may be larger than width d1 of first light emitter 20a which emits light having a low color temperature. With this configuration, the light of high color temperature is more easily diffused, and easily mixed with the light having a low color temperature. Accordingly, the luminance unevenness and the color unevenness of the light emitted by light-emitting device 1a can be reduced.

Although in the present variation, the example is shown in which first light emitter 20a, second light emitter 30, and reflector 40a are different in width, the present disclosure is not limited to this. For example, as in Embodiment 1, width d1 of first light emitter 20a and width d2 of second light emitter 30 may be the same, and only width d3 of reflector 40a may be different from d1 (=d2). Alternatively, width d3 of reflector 40a may be the same as width d1 of first light emitter 20a, or may be the same as width d2 of second light emitter 30.

Variation 2

Figure 8:
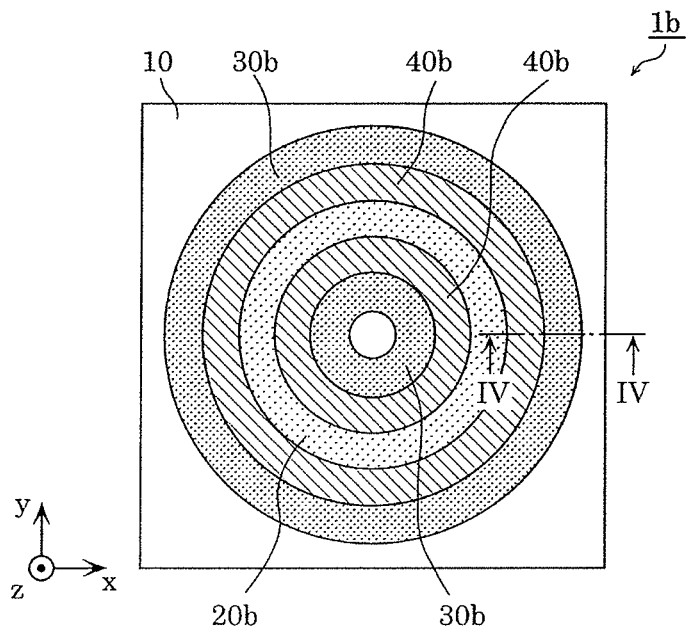
FIG. 8 is a plan view of a light-emitting device according to Variation 2 of Embodiment 1.

Next, a light-emitting device according to Variation 2 is described with reference to FIG. 8. FIG. 8 is a plan view of light-emitting device 1b according to the present variation. Note that in FIG. 8, diagonal lines are used to make the positions and shapes of reflectors 40b visually recognizable.

As compared with light-emitting device 1 according to Embodiment 1, light-emitting device 1b according to the present variation differs in that light-emitting device 1b includes first light emitter 20b, second light emitters 30b, and reflectors 40b, instead of first light emitters 20, second light emitters 30, and reflectors 40. In the present variation, the plan view shapes of first light emitter 20b, second light emitters 30b, and reflectors 40b are different from the plan view shapes of first light emitters 20, second light emitters 30, and reflectors 40 according to Embodiment 1.

Specifically, as illustrated in FIG. 8, first light emitter 20b, reflectors 40b, and second light emitters 30b are disposed in circular ring shapes with a predetermined point being a common center. The predetermined point is, for example, the center of substrate 10. Specifically, first light emitter 20b, reflectors 40b, and second light emitters 30b are formed concentrically.

The cross-sectional shape of light-emitting device 1b according to the present variation, taken along line IV-IV illustrated in FIG. 8 is approximately the same as the cross-sectional shape of light-emitting device 1 illustrated in FIG. 4. In other words, first light emitter 20b, reflector 40b, and second light emitter 30b decrease in height from substrate 10 in stated order.

As described above, in light-emitting device 1b according to the present variation, first light emitter 20b, reflectors 40b, and second light emitters 30b are disposed in circular ring shapes with the predetermined point being the common center.

With this configuration, as in Embodiment 1, decline in light emission efficiency can be reduced, and generation of color unevenness and luminance unevenness can be reduced. Moreover, since first light emitter 20b and second light emitters 30b are disposed in approximately circular ring shapes, approximately uniform light can be emitted to all directions. Therefore, generation of luminance unevenness and color unevenness can be further reduced in light-emitting device 1b according to the present variation.

Variation 3

Figure 9:
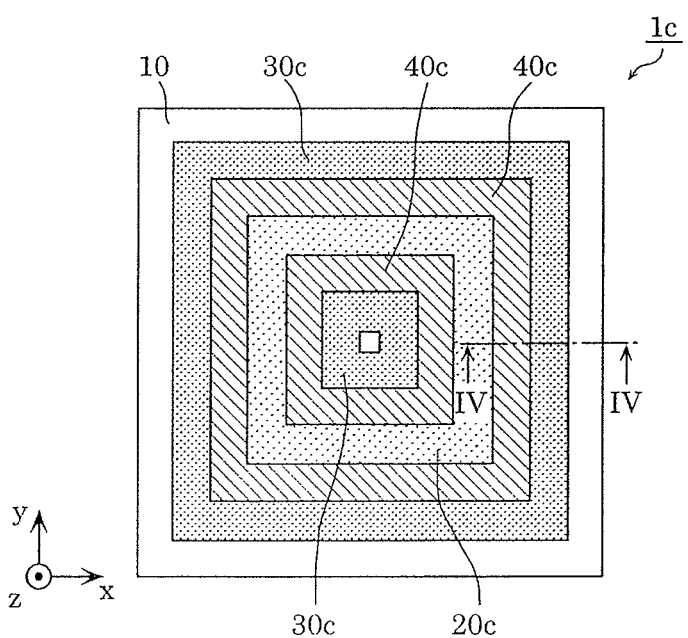
FIG. 9 is a plan view of a light-emitting device according to Variation 3 of Embodiment 1.

Next, a light-emitting device according to Variation 3 is described with reference to FIG. 9. FIG. 9 is a plan view of light-emitting device 1c according to the present variation. Note that in FIG. 9, diagonal lines are used to make the positions and shapes of reflectors 40c visually recognizable.

As compared with light-emitting device 1 according to Embodiment 1, light-emitting device 1c according to the present variation differs in that light-emitting device 1c includes first light emitter 20c, second light emitters 30c, and reflectors 40c, instead of first light emitters 20, second light emitters 30, and reflectors 40. In the present variation, the plan view shapes of first light emitter 20c, second light emitters 30c, and reflectors 40c are different from the plan view shapes of first light emitters 20, second light emitters 30, and reflectors 40 according to Embodiment 1.

Specifically, as illustrated in FIG. 9, first light emitter 20c, reflectors 40c, and second light emitters 30c are disposed in polygonal ring shapes with a predetermined point being the common center. The predetermined point is, for example, the center of substrate 10. Specifically, first light emitter 20c, reflectors 40c, and second light emitters 30c are formed into concentric polygonal shapes.

In the present variation, the polygonal shapes are approximate square. In other words, each of first light emitter 20c, reflectors 40c, and second light emitters 30c is formed in the shape of a ring along sides of an approximate square. Note that the polygonal shape may be an approximate regular hexagon or an approximate regular octagon. Moreover, the polygonal shape may also be an approximate rectangle.

The cross-sectional shape of light-emitting device 1c according to the present variation, taken along line IV-IV illustrated in FIG. 8 is approximately the same as the cross-sectional shape of light-emitting device 1 illustrated in FIG. 4. In other words, first light emitter 20c, reflector 40c, and second light emitter 30c decrease in height from substrate 10 in stated order.

As described above, in light-emitting device 1c according to the present variation, first light emitter 20c, reflectors 40c, and second light emitters 30c are disposed in polygonal ring shapes with the predetermined point being the common center.

As in Embodiment 1, this makes it possible to reduce decline in light emission efficiency, and generation of color unevenness and luminance unevenness. Since first light emitter 20c and second light emitters 30c are disposed in approximately polygonal ring shapes, an LED chip can be mounted with the same orientation for each side. Therefore, for example, as compared with the case where the LED chips are mounted in the shape of a circular ring, the number of times of changing the mounting direction of the LED chips can be reduced. Therefore, generation of errors in dispositions and orientations of LED chips can be reduced, yield can be improved, and a reliable light-emitting device 1c can be realized.

Embodiment 2

Figure 10:
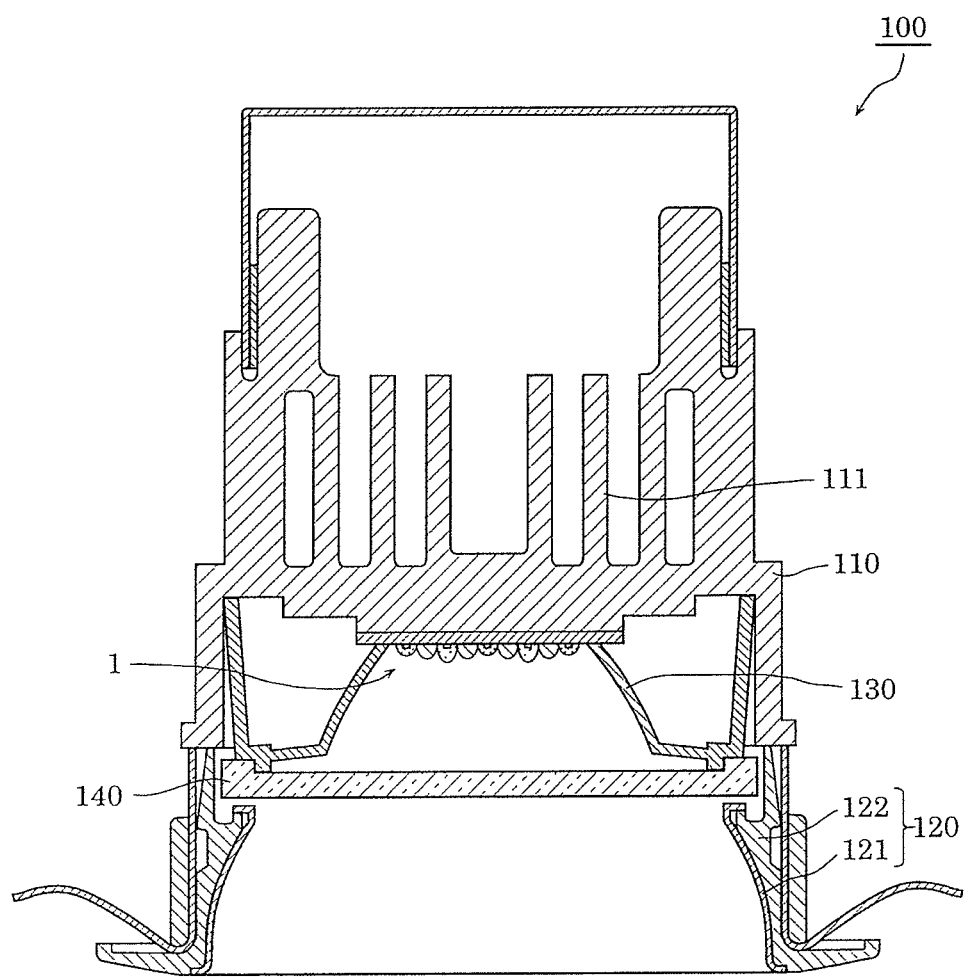
FIG. 10 is a cross-sectional view of an illumination apparatus according to Embodiment 2.
Figure 11:
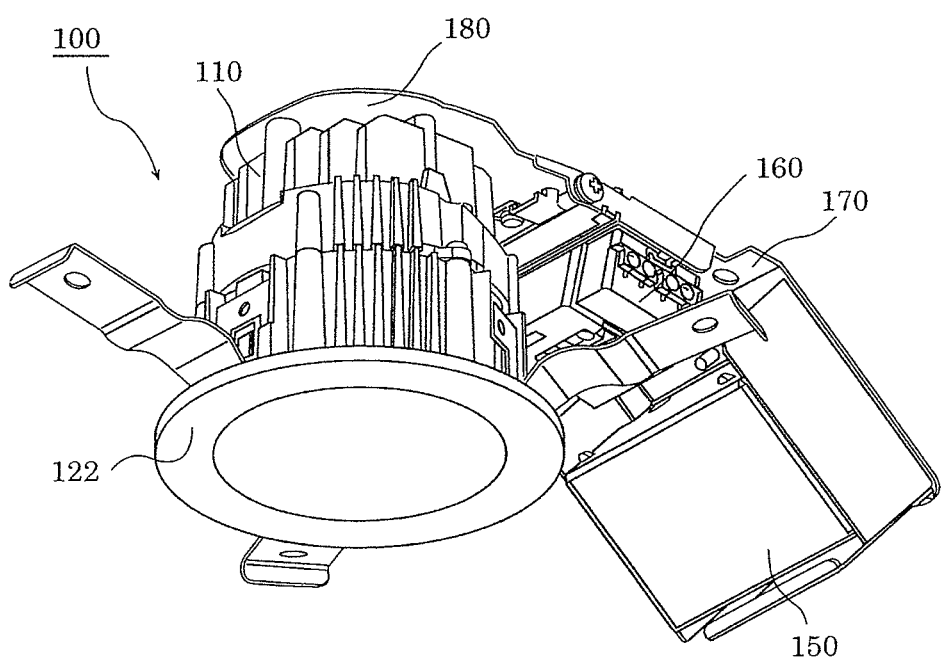
FIG. 11 is an external perspective view of the illumination apparatus and peripheral components of the illumination apparatus according to Embodiment 2.

Next, an illumination apparatus according to Embodiment 2 is described with reference to FIGS. 10 and 11. FIG. 10 is a cross-sectional view of illumination apparatus 100 according to the present embodiment. FIG. 11 is an external perspective view of illumination apparatus 100 and peripheral components of illumination apparatus 100 according to the present embodiment.

As illustrated in FIGS. 10 and 11, illumination apparatus 100 according to the present embodiment is, for example, an embedded illumination apparatus such as a downlight which is embedded in a ceiling of a residence or the like to emit light towards lower parts (a floor surface or a wall).

Illumination apparatus 100 includes light-emitting device 1. Illumination apparatus 100 further includes an approximately cylindrical body having a bottom, reflective plate 130, and translucent panel 140 which are disposed on the body. The body is configured by combining base 110 and frame 120.

Base 110 is a mounting base on which light-emitting device 1 is mounted. Moreover, base 110 functions also as a heat sink (radiator) which dissipates heat generated by light-emitting device 1. Base 110 is formed into approximately cylindrical shape having a bottom using a metallic material. Base 110 includes die-cast aluminum, for example.

On top of base 110 (a portion on the ceiling side), heat dissipating fins 111 extending upward are disposed, spaced apart at regular intervals along one direction. This allows efficient dissipation of the heat generated by light-emitting device 1.

Frame member 120 includes auxiliary reflecting member 121 having an approximately cylindrical shape (funnel shape) and having a reflective inner surface, and frame body 122 on which auxiliary reflecting member 121 is mounted. Auxiliary reflecting member 121 includes a metallic material. Auxiliary reflecting member 121 can be formed by drawing or press forming of aluminum alloy, for example. Frame member 120 is secured by frame body 122 which is mounted on base 110 with fixing screws (not illustrated), etc.

Reflective plate 130 is an approximately-cylindrical-shaped (a funnel-shaped) reflective member having internal reflectivity. Reflective plate 130 includes a metallic material such as aluminum, for example. Alternatively, reflective plate 130 may be formed using a rigid white resin material.

Light-transmissive panel 140 is a light-transmissive member that is light diffusible and light transmissive. Light-transmissive panel 140 is a flat plate disposed between reflective plate 130 and frame member 120, and is attached to reflective plate 130. Light-transmissive panel 140 is formed into a disc shape using a transparent resin material, such as an acrylic (PMMA) and a polycarbonate (PC), for example.

Note that illumination apparatus 100 does not need to include light-transmissive panel 140. When light-transmissive panel 140 is not included, the luminous flux of the light emitted from illumination apparatus 100 can be improved.

Moreover, as illustrated in FIG. 11, illumination apparatus 100 includes lighting apparatus 150 which supplies light-emitting device 1 with electric power for causing light-emitting device 1 to emit light and terminal board 160 which relays alternating current power from an external power source, such as commercial power supply, to lighting apparatus 150. Specifically, lighting apparatus 150 converts the alternating current power relayed from terminal board 160 into direct current power, and supplies the converted direct current power to light-emitting device 1.

Lighting apparatus 150 and terminal board 160 are secured to mounting plate 170 provided separately from the body. Mounting plate 170 is formed by bending a quadrilateral plate member which includes a metallic material. Lighting apparatus 150 is secured onto the undersurface of one end portion in the longitudinal direction of mounting plate 170, and terminal board 160 is secured to the undersurface of the other end portion. Mounting plate 170 is connected to top plate 180 secured on top of base 110 of the body.

As described above, illumination apparatus 100 according to the present embodiment includes, for example, light-emitting device 1 and lighting apparatus 150 which supplies light-emitting device 1 with electric power for causing light-emitting device 1 to emit light.

With this configuration, since illumination apparatus 100 includes light-emitting device 1, decline in light emission efficiency can be reduced, and generation of color unevenness and luminance unevenness can be reduced.

Note that in the present embodiment, illumination apparatus 100 may include one of light-emitting devices 1a to 1c described in Variations 1 to 3 of Embodiment 1, instead of light-emitting device 1. Also in this case, as in each of the variations, decline in light emission efficiency can be reduced, and generation of color unevenness and luminance unevenness can be reduced.

Moreover, while a downlight is shown as one example of illumination apparatus 100 in the present embodiment, the configuration of the downlight is not limited to the example illustrated in the drawings. The present disclosure is not limited to the downlight, and may be implemented as any other illumination apparatus, such as a spotlight and a ceiling light.

Others

While the light-emitting device and the illumination apparatus according to the present disclosure have been described above based on the above-described embodiments and variations thereof, the present disclosure is not limited to the embodiments described above.

For example, while an example is described in which reflector 40 is formed separately from substrate 10 using a resin material in the embodiments described above, the configuration is not limited to this. Reflector 40 may be a part of substrate 10. Specifically, reflector 40 may be a projection projected from the mounting surface of substrate 10. The projection is a white resist layer, etc. provided on the surface of substrate 10, for example. The cross-sectional shape of the projection is a quadrilateral, a triangle, or a semicircle, for example.

Moreover, for example, while an example is described in which first light emitter 20 emits light having a low color temperature and second light emitter 30 emits light having a high color temperature in the embodiments described above, the configuration is not limited to this. First light emitter 20 may emit light having a high color temperature, and second light emitter 30 may emit light having a low color temperature.

Alternatively, first light emitter 20 and second light emitter 30 may emit light having the same light color. In this case, when reflector 40 is not provided between first light emitter 20 and second light emitter 30, the problem of color unevenness hardly occurs, but luminance unevenness may occur. According to the present disclosure, generation of luminance unevenness can be reduced by providing reflector 40.

Moreover, for example, in the above-mentioned embodiment, in first sealing member 22 and second sealing member 32, the light colors of first light emitter 20 and second light emitter 30 are different by using different types of phosphors and containing different amounts of phosphors, but the configuration is not limited to this. For example, the types or the numbers of first LED chips 21 and second LED chips 31 may be different. For example, not only a blue LED chip but a red LED chip may be included in first LED chips 21 included in first light emitter 20.

Moreover, for example, while one example is described in which first light emitters 20, reflectors 40, second light emitters 30 have a line shape in the embodiments described above, they may be disposed in a dot pattern, for example.

Moreover, for example, although the LED chip is described as one example of the light-emitting device included in the light-emitting device in the above-mentioned embodiment, the configuration is not limited to this. The light-emitting device may be other solid light-emitting devices, for example, semiconductor light-emitting elements such as a semiconductor laser, or an organic Electroluminescence (EL), or an inorganic EL.

In other instances, various modifications to the embodiments according to the present disclosure described above that may be conceived by those skilled in the art and embodiments implemented by any combination of the components and functions shown in the embodiments are also included within the scope of the present disclosure, without departing from the spirit of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting device, comprising:
a substrate;
a first light emitter and a second light emitter which are disposed on the substrate; and
a reflector which is disposed on the substrate and reflects light emitted by the first light emitter,
wherein the first light emitter, the reflector, and the second light emitter are aligned in stated order in a direction from a center toward a periphery of the substrate in a plan view, and
the first light emitter, the reflector, and the second light emitter decrease in height in stated order, the height being measured from the substrate.

2. The light-emitting device according to claim 1, wherein the first light emitter, the reflector, and the second light emitter are respectively disposed in approximately parallel lines.

3. The light-emitting device according to claim 1, wherein the first light emitter, the reflector, and the second light emitter are disposed in one of circular ring shapes and polygonal ring shapes which have a common center.

4. The light-emitting device according to claim 1, wherein a first color temperature of first light emitted by the first light emitter, and a second color temperature of second light emitted by the second light emitter are different from each other.

5. The light-emitting device according to claim 4, wherein the first color temperature is lower than the second color temperature, and
a length of the first light emitter is longer than a length of the second light emitter in an alignment direction in which the first light emitter, the reflector, and the second light emitter are aligned.

6. The light-emitting device according to claim 1, wherein a length of the reflector is shorter than a length of the first light emitter and a length of the second light emitter in an alignment direction in which the first light emitter, the reflector, and the second light emitter are aligned.

7. The light-emitting device according to claim 1, wherein the first light emitter, the reflector, and the second light emitter are provided symmetrically with respect to the center of the substrate, in the plan view of the substrate.

8. The light-emitting device according to claim 1, wherein the second light emitter is a light emitter nearest to the periphery of the substrate.

9. The light-emitting device according to claim 1, wherein a plurality of second light emitters are provided, each being the second light emitter, and
the first light emitter, the reflector, a second light emitter nearest to the periphery of the substrate among the plurality of second light emitters decrease in height in stated order, the height being measured from the substrate.

10. The light-emitting device according to claim 9, wherein the plurality of second light emitters are identical in height, the height being measured from the substrate.

11. The light-emitting device according to claim 9, wherein a plurality of reflectors are provided, each being the reflector, and
the first light emitter, a reflector nearest to the periphery of the substrate among the plurality of reflectors, and the second light emitter nearest to the periphery of the substrate among the plurality of second light emitters decrease in height in stated order, the height being measured from the substrate.

12. The light-emitting device according to claim 11, wherein the plurality of reflectors are identical in height, the height being measured from the substrate.

13. The light-emitting device according to claim 11, wherein a plurality of first light emitters are provided, each being the first light emitter, and
in an alignment direction in which the first light emitter, the reflector, and the second light emitter are aligned, a first light emitter nearest to the periphery of the substrate among the plurality of first light emitters, the reflector nearest to the periphery of the substrate among the plurality of reflectors, and the second light emitter nearest to the periphery of the substrate among the plurality of second light emitters decrease in height in stated order, the height being measured from the substrate.

14. The light-emitting device according to claim 13, wherein the plurality of first light emitters are identical in height, the height being measured from the substrate.

15. The light-emitting device according to claim 13, wherein in the plan view of the substrate, a total area of the plurality of first light emitters and a total area of the plurality of second light emitters are approximately equal.

16. The light-emitting device according to claim 1, wherein the first light emitter and the second light emitter are identical in length, in an alignment direction in which the first light emitter, the reflector, and the second light emitter are aligned.

17. The light-emitting device according to claim 16, wherein the reflector and the second light emitter are identical in length, in the alignment direction in which the first light emitter, the reflector, and the second light emitter are aligned.

18. The light-emitting device according to claim 1, wherein the reflector is in contact with a tangent which is in contact with an external surface of the first light emitter and an external surface of the second light emitter in a cross-sectional view parallel to an alignment direction in which the first light emitter, the reflector, and the second light emitter are aligned.

19. The light-emitting device according to claim 1, wherein the reflector is in contact with the first light emitter and the second light emitter.

20. An illumination apparatus, comprising:
the light-emitting device according to claim 1; and
a lighting apparatus which supplies the light-emitting device with electric power for causing the light-emitting device to emit light.

* * * * *